United States Patent [19]

Suzuki

[11] Patent Number: 4,630,118
[45] Date of Patent: Dec. 16, 1986

[54] AUTOMATIC FREQUENCY CONTROL CIRCUIT FOR A TELEVISION SIGNAL RECEIVING APPARATUS

[75] Inventor: Tomohiro Suzuki, Fuchu, Japan

[73] Assignee: Victor Company of Japan, Ltd., Yokohama, Japan

[21] Appl. No.: 612,620

[22] Filed: May 21, 1984

[30] Foreign Application Priority Data

May 23, 1983 [JP] Japan ................................. 58-90503

[51] Int. Cl.⁴ ............................................. H04N 5/50
[52] U.S. Cl. .................................. 358/195.1; 455/182; 455/192
[58] Field of Search ................ 358/195.1, 191.1, 193.1; 455/182, 192, 263, 164

[56] References Cited

U.S. PATENT DOCUMENTS 3,869,674  3/1975  Borbely ........................... 455/192 X
4,004,233  1/1977  Sakamoto ........................ 455/182 X
4,547,902  10/1985  Kasperkovitz ................... 455/263 X Primary Examiner—James J. Groody
Assistant Examiner—E. Anne Toth
Attorney, Agent, or Firm—Ladas & Parry

[57] ABSTRACT

An AFC circuit is employed in a television signal receiving apparatus which comprises a tuner having a local oscillator and a mixer for mixing a received high-frequency video signal and an output local oscillation frequency signal of the local oscillator so to frequency-convert the received high-frequency television signal to an intermediate frequency signal, and a tuning voltage generating circuit for generating a tuning voltage responsive to a desired receiving channel which is selected so as to apply the tuning voltage to the local oscillator of the tuner. The AFC circuit comprises a frequency discriminating circuit for frequency-discriminating an output intermediate frequency signal of the tuner, a lowpass filter supplied with an output signal of the frequency discriminating circuit, and a limiter circuit supplied with an output signal of the lowpass filter, for limiting the voltage level of the output signal of the lowpass filter depending on the desired receiving channel. The local oscillator receives an output signal of the limiter circuit. The limiter circuit performs a limiting operation in each receiving band when receiving a channel in which a change in the local oscillation frequency is large with respect to a change in the tuning voltage.

6 Claims, 6 Drawing Figures

AUTOMATIC FREQUENCY CONTROL CIRCUIT FOR A TELEVISION SIGNAL RECEIVING APPARATUS

BACKGROUND OF THE INVENTION

The present invention generally relates to automatic frequency control circuits for television signal receiving apparatuses, and more particularly to an automatic frequency control circuit (hereinafter simply referred to as an AFC circuit) for a television signal receiving apparatus, which controls a control voltage supplied to a local oscillator of a tuner depending on the frequency band of the receiving channel and on the tuning voltage of the receiving channel, so that the AFC operation is correctly carried out with respect to each of the channels.

Generally, an AFC circuit of a television signal receiving apparatus frequency-discriminates a signal which is obtained from a video intermediate frequency amplifier circuit. An output signal of the AFC circuit is passed through a lowpass filter, and is then added with a tuning voltage. The added signal is applied to a local oscillator within a tuner so as to control the local oscillation frequency of the local oscillator. As a result, an automatic frequency control (AFC) is carried out so that a video intermediate frequency assumes a predetermined frequency $F_{VIF}$. The lowpass filter has an S-figure output frequency characteristic (so-called S-curve) in which the output D.C. control voltage becomes 0 volt when the video intermediate frequency assumes the predetermined frequency $F_{VIF}$ (58.75 MHz, for example).

The local oscillator within the tuner, receives the tuning voltage which is in accordance with the receiving channel.

The local oscillator within the tuner, receives the tuning voltage which is in accordance with the receiving channel. This tuning voltage applied to the local oscillator and the oscillation frequency of the local oscillator, are not in a linear relationship. In the bands such as the low band of the VHF, the high band of the VHF, and the UHF band, the deviation in the oscillation frequency with respect to a voltage change decreases as the tuning voltage becomes larger, and the deviation in the oscillation frequency with respect to a voltage change increases as the tuning voltage becomes smaller. In other words, the tuning voltage applied to the local oscillator and the oscillation frequency of the local oscillator, are in a non-linear relationship. On the other hand, the output control voltage of the lowpass filter changes according to the frequency of the video intermediate frequency signal. For this reason, the pull-in range of the AFC differs and the effect of the AFC accordingly differs depending on the receiving channel. For example, when receiving a channel in which the deviation in the oscillation frequency is large with respect to a change in the tuning voltage which is applied to the local oscillator, the pull-in range of the AFC is wide, and the AFC may be carried with respect to an audio carrier of that channel or with respect to a video carrier or the like of an adjacent channel. Thus, there was a possibility that the desired channel cannot be received properly.

Hence, there was a conventional AFC circuit which was designed not to carry out the AFC operation for a predetermined time when the channel was changed. However, in this conventional AFC circuit, there was a disadvantage in that it took a certain time until the AFC operation is carried out and the pull-in to the desired channel is completed after the channel was changed.

SUMMARY OF THE INVENTION

Accordingly, it is a general object of the present invention to provide a novel and useful AFC circuit for a television signal receiving apparatus, in which the problems described heretofore have been eliminated.

Another and more specific object of the present invention is to provide an AFC circuit for a television signal receiving apparatus, which limits the amplitude of a control voltage which is applied to a local oscillator when receiving a desired channel in which the deviation in an oscillation frequency of a local oscillator is large with respect to a tuning voltage which is applied to the local oscillator. According to the AFC circuit of the present invention, the AFC operation will not be erroneously carried out with respect to an audio carrier of the desired channel or with respect to a video carrier or the like of an adjacent channel, and it will never become impossible to receive the desired channel.

Still another object of the present invention is to provide an AFC circuit for a television signal receiving apparatus, in which a reference voltage in accordance with each band and a tuning voltage in accordance with a receiving channel are compared, an amplitude limiting operation of a limiter for limiting the amplitude of a control voltage which is to be supplied to a local oscillator is controlled depending on the compared result, and the pull-in range of the AFC is switched so as to switch the effectiveness of the AFC.

A further object of the present invention is to provide an AFC circuit for a television signal receiving apparatus, in which the level of a control signal voltage applied to a local oscillator circuit is limited for a predetermined duration when the channel is changed. According to the AFC circuit of the present invention, the AFC operation is also carried out to a certain extent when the channel is changed, so as not to carry out an erroneous AFC operation. Thus, when the channel is changed to a desired channel, the pull-in time to the desired channel is extremely short, and a satisfactory reception can be made immediately after the channel is changed.

Other objects and further features of the present invention will be apparent from the following detailed description when read in conjunction with the accompanying drawings.

DETAILED DESCRIPTION

Figure 1:
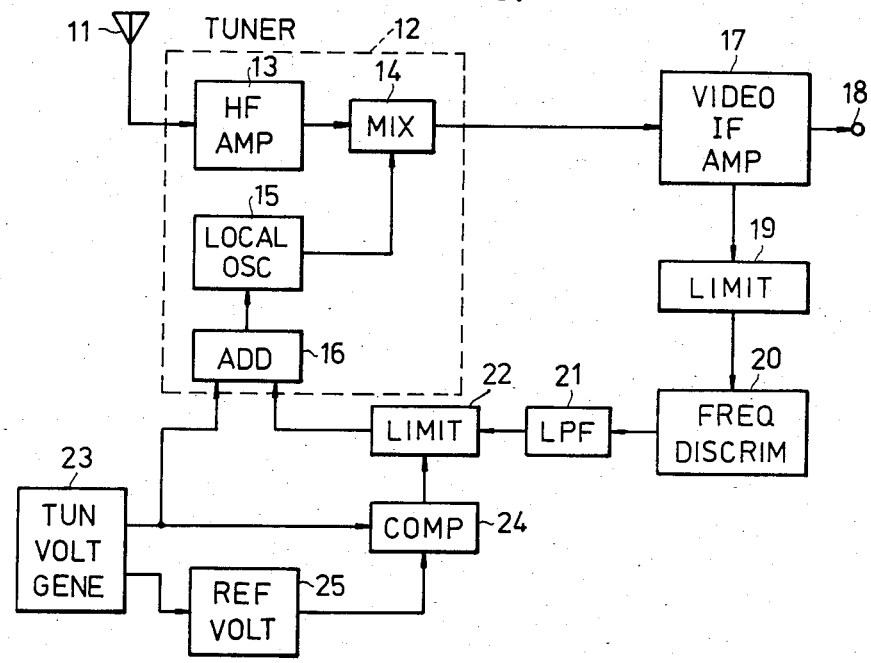
FIG. 1 is a systematic block diagram showing a first embodiment of an AFC circuit for a television signal receiving apparatus according to the present invention.

In FIG. 1, a high-frequency television signal received by an antenna 11, is supplied to a tuner 12. In the tuner 12, the high-frequency television signal is amplified in an amplifier 13, and is then supplied to a mixer 14. The high-frequency signal supplied to the mixer 14, is mixed with an output signal of a local oscillator 15 having a local oscillation frequency, and is frequency-converted into a video intermediate frequency signal. The video intermediate frequency signal from the mixer 14 is amplified in a video intermediate frequency amplifier 17, and is then supplied to a video detecting circuit (not shown) in a subsequent stage through an output terminal 18.

Figure 2:
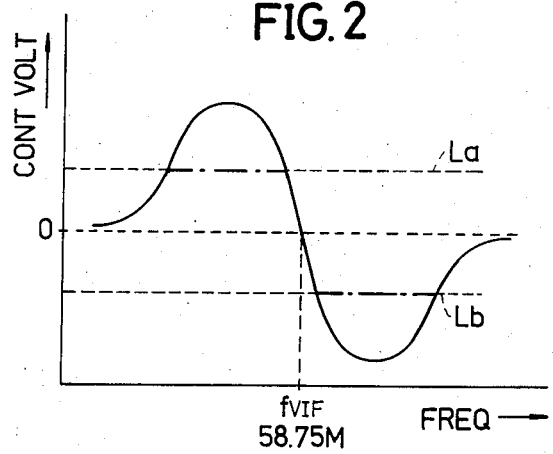
FIG. 2 is a graph showing a relationship between a control voltage and frequency.

On the other hand, the video intermediate frequency signal from the video intermediate frequency amplifier 17, eliminates an amplitude deviation component thereof in a limiter 19. An output signal of the limiter 19 is subjected to a frequency discrimination in a frequency discriminator 20. A frequency discriminated signal from the frequency discriminator 20, eliminates a video signal component thereof in a lowpass filter 21. A D.C. control voltage produced from the lowpass filter 21 has an S-figure characteristic (so-called S-curve) shown in FIG. 2 in which the D.C. control voltage becomes 0 volt at a predetermined frequency $F_{VIF}$. The output control voltage of the lowpass filter 21 is supplied to an adder 16 through a limiter 22 which will be described later on in the specification. The adder 16 adds the output signal of the limiter 22 and a tuning voltage from a tuning voltage generating circuit 23, and supplies an added signal to the local oscillator 15 so as to control the local oscillation frequency of the local oscillator 15. Accordingly, an automatic frequency control (AFC) is carried out so that the frequency of the video intermediate frequency signal from the mixer 14 assumes the predetermined frequency $F_{VIF}$.

Figure 3:
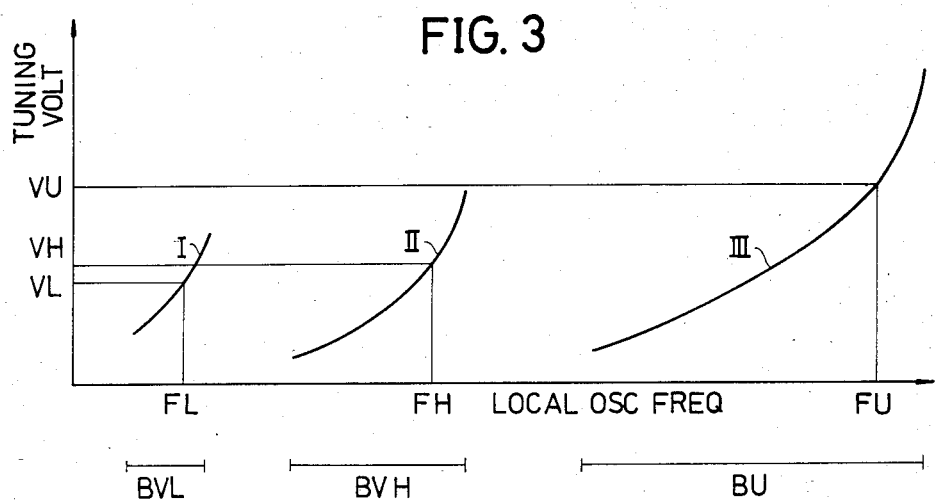
FIG. 3 is a graph showing a relationship between a tuning voltage and a local oscillation frequency.

A non-linear relationship shown in FIG. 3 exists between the tuning voltage generated from the tuning voltage generating circuit 23 and the output local oscillation frequency of the local oscillator 15. In FIG. 3, the local oscillation frequencies with respect to the low band of the VHF, the high band of the VHF, and the UHF band, are respectively represented by BVL, BVH, and BU. Further, curves I, II, and III respectively show tuning voltage versus local oscillation frequency characteristics for each of the above bands. As may be seen from FIG. 3, the rate of change in the local oscillation frequency with respect to a change in the tuning voltage becomes larger as the tuning voltage becomes smaller, for each of the curves I, II, and III. Hence, when receiving a desired channel having a low tuning voltage, that is, a channel in one of the above bands with a low local oscillation frequency, the pull-in range of the AFC is wide, and the AFC may be carried out with respect to an audio carrier of that channel or with respect to a video carrier or the like of an adjacent channel. Thus, there was a possibility that the desired channel could not be received properly.

Accordingly, the present invention has eliminated this problem, and description will hereinafter be given with respect to the details of the present invention. The tuning voltage from the tuning voltage generating circuit 23, is supplied to the adder 16 and to a comparator 24. The comparator 24 compares this tuning voltage with a reference voltage from a reference voltage source 25, and produces a limiter control signal. This limiter control signal produced from the comparator 24 assumes a low level when the tuning voltage is greater than the reference voltage, and assumes a high level when the tuning voltage is smaller than the reference voltage. The control signal from the comparator 24 is supplied to the limiter 22.

When the limiter 22 receives a low-level control signal from the comparator 24, the limiter 22 does not perform a limiting operation. On the other hand, when the limiter 22 receives a high-level control signal from the comparator 24, the limiter 22 performs a limiting operation so as to limit the control voltage within limiting levels $L_a$ and $L_b$. Accordingly, when receiving a desired channel in which the deviation in the local oscillation frequency is large with respect to a change in the tuning voltage, the control voltage which is applied to the local oscillator 15 from the lowpass filter 21 through the limiter 22, is limited so as to decrease the pull-in range of the AFC. As a result, it is possible to prevent the AFC operation from being carried out with respect to an audio carrier of the desired channel or with respect to a video carrier of an adjacent channel, when receiving the desired channel.

Figure 4:
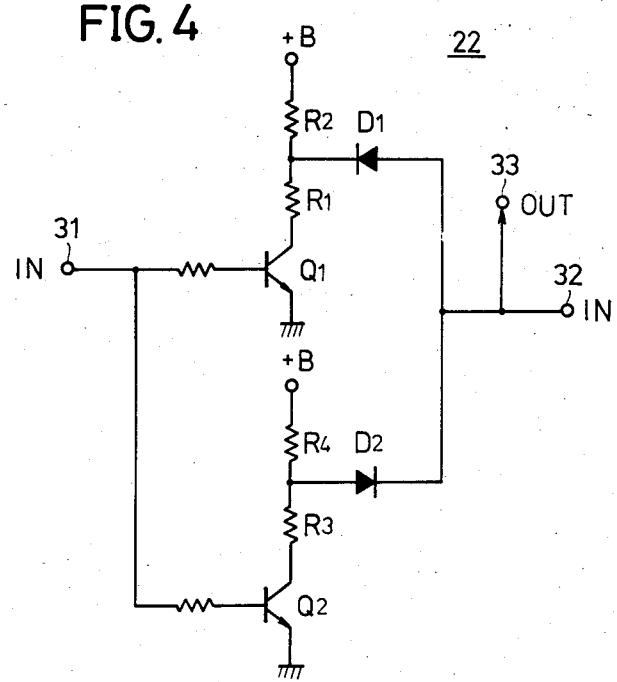
FIG. 4 is a circuit diagram showing an embodiment of a limiter in the block system shown in FIG. 1.

An embodiment of a concrete circuit of the limiter 22 which performs the operation described heretofore, will now be described by referring to FIG. 4. In FIG. 4, the limiter control signal from the comparator 24 is supplied to a terminal 31, and is applied to respective bases of NPN type transistors Q1 and Q2 having emitters thereof grounded. Resistors R1 and R2 are coupled between a collector of the transistor Q1 and a power source +B, and resistors R3 and R4 are coupled between a collector of the transistor Q2 and the power source +B. A cathode of a diode D1 is coupled to a connection point between the resistors R1 and R2, and an anode of a diode D2 is coupled between a connection point between the resistors R3 and R4. An anode of the diode D1 and a cathode of the diode D2 are commonly coupled to an input terminal 32. The output control signal of the lowpass filter 21 is applied to this input terminal 32. The anode of the diode D1, the cathode of the diode D2, and the input terminal 32 are commonly coupled to an output terminal 33. A signal produced through the output terminal 33 is supplied to the adder 16. Thus, the limiter 22 is coupled between ground, and a point between the input terminal 32 and the output terminal 33.

When the low-level limiter control signal is applied to the terminal 31, the transistors Q1 and Q2 remain OFF, and the limiter 22 does not perform a limiting operation. Thus, the control signal which is applied to the input terminal 32 from the lowpass filter 21, is produced through the output terminal 33 unchanged and is supplied to the adder within the tuner 12.

On the other hand, when the high-level limiter control signal is applied to the terminal 31, the transistors Q1 and Q2 are turned ON. Accordingly, the control signal which is applied to the input terminal 32 from the lowpass filter 21, is limited within the limiting levels $L_a$ and $L_b$. In other words, a part of the output control signal of the lowpass filter 21 having an amplitude greater than or equal to the voltage level $L_a$ at the connection point between the resistors R1 and R2, and a part of the output control signal of the lowpass filter 21 having an amplitude less than or equal to the voltage level $L_b$ at the connection point between the resistors R3 and R4, are limited in the limiter 22. Therefore, a control signal produced through the output terminal 33, is limited between the voltage levels $L_a$ and $L_b$ as indicated by a one-dot chain line in FIG. 2.

Figure 5:
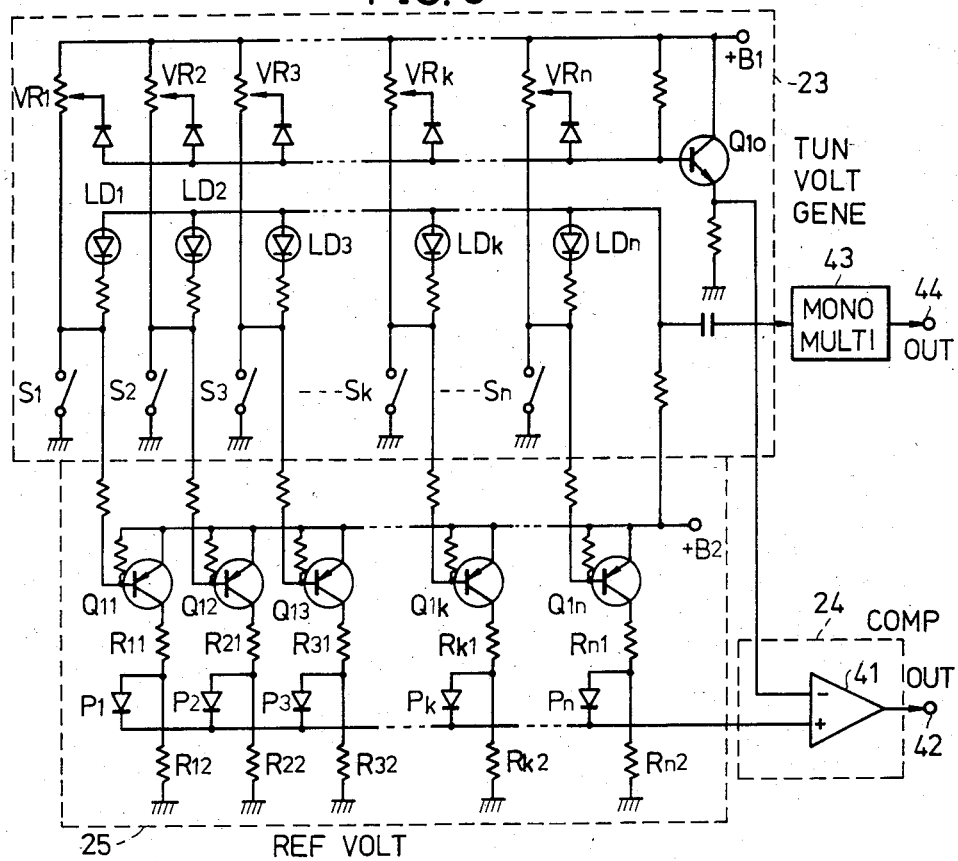
FIG. 5 is a circuit diagram showing an embodiment of a concrete circuit of an essential part of the block system shown in FIG. 1.

An embodiment of a circuit part which is made up of the tuning voltage generating circuit 23, the comparator 24, and the reference voltage source 25, and generates the limiter control signal, is shown in FIG. 5. In the tuning voltage generating circuit 23, one of channel selection switches S1 through Sn is selectively closed responsive to an operation of changing the desired receiving channel. Variable resistors VR1 through VRn are coupled between the power source +B1 and the respective channel selection switches S1 through Sn. The resistances of the variable resistors VR1 through VRn are set to values such that it is possible to obtain tuning voltages corresponding to the channels of the respective channel selection switches S1 through Sn. Sliders of the variable resistors VR1 through VRn are respectively coupled to an inverting input terminal of an operational amplifier 41 which constitutes the comparator 24, through a transistor Q10.

The reference voltage source 25 comprises transistors Q11 through Q1n each having an emitter thereof coupled to a power source +B2. Bases of the transistors Q11 through Q1n are coupled to the respective switches S1 through Sn. Resistors R11 and R12 are coupled in series between ground and a collector of the transistor Q11. Resistors R21 and R22 are coupled in series between ground and a collector of the transistor Q12. Similarly, resistors R31 and R32, . . . , and resistors Rn1 and Rn2 are coupled between ground and respective collectors of the transistors Q13, and Q1n. A connection point between the resistors R11 and R12 is coupled to a non-inverting input terminal of the operational amplifier 41 in the comparator 24. A connection point between the resistors R21 and R22 is also coupled to the non-inverting input terminal of the operational amplifier 41. Similarly, connection points between the resistors R31 and R32, . . . , are commonly coupled to the non-inverting input terminal of the operational amplifier 41. For example resistances of the resistors R11 and R12 are selected to values so that a voltage at the connection point P1 subject to the voltage division by the resistors R11 and R12, assumes a reference voltage VL of the band BVL shown in FIG. 3. The resistances of the resistors corresponding to the channel in the low band of the VHF are selected similarly. Similarly, the resistances of the resistors coupled to the transistors which are among the transistors Q11 through Q1n and correspond to the channel in the high band of the VHF, are respectively selected so that the voltage at a connection point corresponding to the channel among the connection points P1 through Pn assumes a reference voltage VH of the band BVH. Further, the resistances of the resistors are selected so that the voltage at a connection point corresponding to the channel in the UHF band assumes a reference voltage VU of the band BU. An output terminal 42 of the comparator 24 is coupled to the terminal 31 shown in FIG. 3.

The switches S1 through Sn are also coupled to the power source +B2 and to a monostable multivibrator 43, is coupled respective light emitting diodes (LEDs) LD1 through LDn. output terminal 44 of the monostable multivibrator 43, is coupled to the terminal 31 shown in FIG. 4.

For example, it will be assumed that, among the channels in the high band of the VHF, a desired channel corresponding to a local oscillation frequency lower than the local oscillation frequency FH which corresponds to the voltage VH shown in FIG. 3, is to be received. In this case, a switch (a switch Sk, for example) corresponding to this desired channel is closed. A LED LDk corresponding to the switch Sk emits light, and displays the number of the selected channel. In addition, the voltage at the connection point which is between resistors Rk1 and Rk2 and corresponds to the switch Sk, is supplied to the non-inverting input terminal of the operational amplifier 41 as the reference voltage VH. On the other hand, the tuning voltage from the variable resistor VRk which is coupled to the switch Sk, is supplied to the inverting input terminal of the operational amplifier 41 through the transistor Q10. In this case, the tuning voltage is smaller than the reference voltage VH, and for this reason, the operational amplifier 41 produces a high-level output signal. This high-level output signal of the operational amplifier 41 is supplied to the limiter 22, and the limiter 22 performs the limiting operation.

On the other hand, it is possible to assume a case where, among the channels in the high band of the VHF, a desired channel corresponding to a local oscillation frequency higher than the local oscillation frequency FH which corresponds to the voltage VH shown in FIG.3, is to be received. In this case, the switch corresponding to this desired channel is closed, and the LED corresponding to this switch emits light to display the number of the selected channel. In addition, the voltage at the connection point which is between the resistors and corresponds to the above switch, is supplied to the non-inverting input terminal of the operational amplifier 41 as the reference voltage VH. Further, the tuning voltage from the variable resistor which is coupled to the above switch, is supplied to the inverting input terminal of the operational amplifier 41 through the transistor Q10. In this case, the tuning voltage is larger than the reference voltage VH, and thus, the operational amplifier 41 produces a low-level output signal. The limiter 22 which receives this low-level output signal of the operational amplifier 41, does not perform the limiting operation. As a result, the output of the lowpass filter 21 is supplied to the adder 16 unchanged.

The operation described heretofore is similarly carried out when selecting a desired channel in the bands BVL and BU.

When one of the switches S1 through Sn is closed, the LED corresponding to the closed switch emits light, and the monostable multivibrator 43 is triggered by a signal which is produced by the closure of the one switch. Hence, the monostable multivibrator 43 produces a signal having a pulse width which is determined by the time constant of the monostable multivibrator 43. The output signal of the monostable multivibrator 43 is supplied to the limiter 22 through the output terminal 44, so as to operate the limiter 22 for the duration of the pulse width.

Conventionally, measures were taken so that the AFC operation was prevented from being carried out responsive to the output signal of the monostable multivibrator every time the channel was changed. In addition, measures were taken so that the AFC operation was prevented from being carried out with respect to an adjacent channel and the pull-in to the adjacent channels was prevented, for example. However, in this conventional example, the AFC operation was carried out in the normal manner, every time the channel was changed. Thus, there was a disadvantage in that it took a certain time until the picture of the desired channel could be normally obtained after the channel was changed.

On the other hand, according to the present embodiment of the AFC circuit, the output signal of the monostable multivibrator 43 is supplied to the limiter 22 to limit the level of the control signal voltage to an extent such that the AFC operation will not be carried out erroneously. Therefore, it is possible to normally obtain the picture of the desired channel immediately after the channel is changed.

Figure 6:
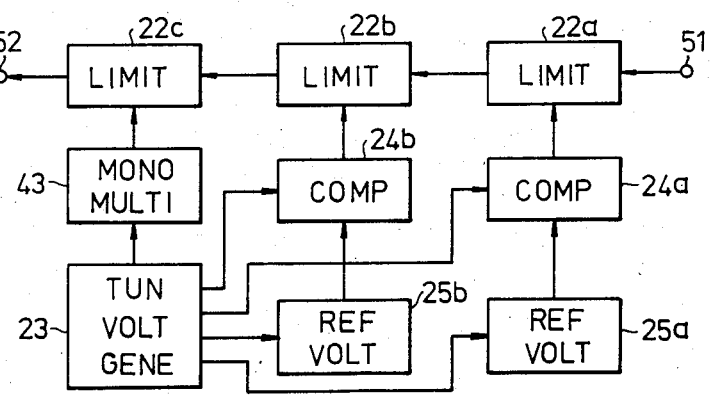
FIG. 6 is a systematic block diagram showing a second embodiment of an AFC circuit for a television signal receiving apparatus according to the present invention.

Next, description will be given with respect to a second embodiment of the AFC circuit according to the present invention, by referring to FIG. 6. In FIG. 6, three limiters 22a, 22b, and 22c are coupled in series, and the output control signal of the lowpass filter 21 is supplied to the limiter 22a through a terminal 51. The limiter 22a receives an output limiter control signal of a comparator 24a, and the limiter 22b receives an output limiter control signal of a comparator 24b. The limiter control signals supplied to the limiters 22a and 22b control the limiting operations of the respective limiters 22a and 22b. In other words, the limiters 22a and 22b perform a limiting operation or do not carry out the limiting operation depending on the respective limiter control signals supplied thereto. Reference voltage sources 25a and 25b respectively generate a reference voltage for the VHF band and a reference voltage for the UHF band, for example, according to signals which are generated from the tuning voltage generating circuit 23 responsive to the channel selection. The output signal of the reference voltage source 25a is supplied to the comparator 24a, and the output signal of the reference voltage source 25b is supplied to the comparator 24b. The comparators 24a and 24b receive tuning voltages which are generated from the tuning voltage generating circuit 23 responsive to the selected channel. The comparator 24a compares the tuning voltage with the reference voltage from the reference voltage source 25a, and the comparator 24b compares the tuning voltage with the reference voltage from the reference voltage source 25b. The comparators 24a and 24b each produce a high-level limiter control signal when the tuning voltage is smaller than the reference voltage, and produce a low-level limiter control signal when the tuning voltage is larger than the reference voltage. The limiter control signals produced from the comparators 24a and 24b are supplied to the respective limiters 22a and 22b to control the limiting operations thereof, that is, to turn the limiting operations thereof ON and OFF. The limiting voltage levels of the limiters 22a and 22b are set to mutually different levels, so that the limiters 22a and 22b perform limiting operations suited for each of the VHF and UHF bands. Accordingly, the output control signal of the lowpass filter 21 is subjected to no limiting operation in the limiters 22a and 22b or is subjected to a limiting operation in one of the limiters 22a and 22b, depending on the receiving channel.

The limiter 22c receives a channel changing signal which has a predetermined pulse width and is produced from the monostable multivibrator 43. The limiter 22c performs a limiting operation with respect to the incoming control signal, only for the duration of the predetermined pulse width. The limiting levels of the limiter 22c are set so that the AFC operation is carried out to an extent such that the AFC operation is not carried out erroneously when the channel is changed. The output signal of the limiter 22c is supplied to the tuner 12 through a terminal 52.

Further, the present invention is not limited to these embodiments, but various variations and modifications may be made without departing from the scope of the present invention.

What is claimed is:

1. An automatic frequency control circuit for a television signal receiving apparatus, said television signal receiving apparatus comprising a tuner having a local oscillator and a mixer for mixing a received high-frequency video signal and an output local oscillation frequency signal of said local oscillator to frequency-convert the received high-frequency television signal to an intermediate frequency signal, and a tuning voltage generating circuit for generating a tuning voltage responsive to a desired receiving channel which is selected so as to apply the tuning voltage to said local oscillator of said tuner, said automatic frequency control circuit comprising:

frequency discriminating means for frequency-discriminating an output intermediate frequency signal of said tuner;

a lowpass filter supplied with an output signal of said frequency discriminating means;

limiter means supplied with an output signal of said lowpass filter, for limiting the voltage level of said output signal of said lowpass filter depending on the desired receiving channel, said local oscillator receiving an output signal of said limiter means, said limiter means performing a limiting operation in each receiving band when receiving a channel in which a change in the local oscillation frequency is large with respect to a change in the tuning voltage; and means for producing a predetermined signal having a predetermined time width responsive to a selection of the desired receiving channel, said predetermined signal being supplied to said limiter means so that said limiter means limits the voltage level of the output signal of said lowpass filter for a duration of said predetermined time width when the desired receiving channel is selected.

2. An automatic frequency control circuit for a television signal receiving apparatus, said television receiving apparatus comprising a tuner having a local oscillator and a mixer for mixing a received high-frequency video signal and an output local oscillation frequency signal of said local oscillator to frequency-convert the received high-frequency television signal to an intermediate frequency signal, and a tuning voltage generating circuit for generating a tuning voltage responsive to a desired receiving channel which is selected so as to apply the tuning voltage to said local oscillator of said tuner, said automatic frequency control circuit comprising:

frequency discriminating means for frequency-discriminating an output intermediate frequency signal of said tuner;

a lowpass filter supplied with an output signal of said frequency discriminating means; and limiter means supplied with an output signal of said lowpass filter, for limiting the voltage level of said output signal of said lowpass filter depending on the desired receiving channel, said local oscillator receiving an output signal of said limiter means, said limiter means performing a limiting operation in each receiving band when receiving a channel in which a change in the local oscillation frequency is large with respect to a change in the tuning voltage, said limiter means comprising a limiter for assumimg either a limiting state in which the voltage level of the output signal of said lowpass filter is limited or a non-limiting state in which the voltage level of the output signal of said lowpass filter is not limited, a reference voltage source for generating a reference voltage, and a comparator for comparing the reference voltage from said reference voltage source with the tuning voltage which is obtained from said tuning voltage generating circuit and corresponds to the receiving channel, and for supplying a limiter control signal to said limiter, said limiter control signal putting said limiter in the limiting state when said tuning voltage is smaller than said reference voltage and putting said limiter in the non-limiting state when said tuning voltage is larger than said reference voltage.

3. An automatic frequency control circuit as claimed in claim 2 in which said comparator comprises an operational amplifier for producing a limiter control signal which assumes a high level when said tuning is smaller than said reference voltage and assumes a low level when said tuning voltage is larger than said reference voltage, said operational amplifier has a non-inverting input terminal supplied with said reference voltage and an inverting input terminal supplied with said tuning voltage, and said limiter limits the voltage level of the output sigal of said lowpass filter when the limiter control signal from said operational amplifier assumes a high level and passes the output signal of said lowpass filter unchanged when the limiter control signal from said operational amplifier assumes a low level.

4. An automatic frequency control circuit as claimed in claim 2 in which said television signal receiving apparatus receives television signals of a plurality of channels in different bands, and said reference voltage source supplies to said limiter predetermined plurality of reference voltages with respect to said different bands.

5. An automatic frequency control circuit for a television signal receiving apparatus, said television signal receiving apparatus comprising a tuner having a local oscillator and a mixer for mixing a received high-frequency video signal and an output local oscillation frequency signal of said local oscilator to frequency-convert the received high-frequency television signal to an intermediate frequency signal, and a tuning voltage generating circuit for generating a tuning voltage responsive to a desired receiving channel which is selected so as to apply the tuning voltage to said local oscillator of said tuner, said automatic frequency control circuit comprising:

frequency discriminating means for frequency-discriminating an output intermediate frequency signal of said tuner;

a lowpass filter supplied with an output signal of said frequency discriminating means; and limiter means supplied with an output signal of said lowpass filter, for limiting the voltage level of said output signal of said lowpass filter depending on the desired receiving channel, said local oscillator receiving an output signal of said limiter means, said limiter means performing a limiting operation in each receiving band when receiving a channel in which a change in the local oscillation frequency is large with respect to a change in the tuning voltage, said limiter means comprising a plurality of limiters coupled in series for assuming either one of a limiting state in which the voltage level of the output signal of said lowpass filter is limited and a non-limiting state in which the voltage level of the output signal of said lowpass filter is not limited, a plurality of reference voltage sources for generating a plurality of mutually different reference voltages depending on a band of a received signal, and a plurality of comparators provided correspondingly to each of said limiters, for comparing the reference voltages from each of said reference voltage sources with the tuning voltage which is obtained from said tuning voltage generating circuit and corresponds to the receiving channel, and for supplying a limiter control signal to each of the corresponding limiters, said limiter control signal putting said corresponding limiter in the limiting state when said tuning voltage is small than said reference voltage and putting said limiter in the non-limiting state when said tuning voltage is larger than said reference voltage.

6. An automatic frequency control circuit as claimed in claim 5 which further comprises means for producing a predetermined signal having a predetermined time width responsive to a selection of a desired receiving channel, and another limiter coupled in series with said plurality of limiters and having alimiting level different from the limiting levels of said plurality of limiters, said predetermined signal being supplied to said other limiter so that said other limiter limits the voltage level of the output signal of said lowpass filter for a duration of said predetermined time width when the desired receiving channel is selected.

* * * * *